(12) United States Patent
Ducourant

(10) Patent No.: US 6,528,775 B2
(45) Date of Patent: Mar. 4, 2003

(54) CHARGE-READING CIRCUIT PROTECTED AGAINST OVERLOADS COMING FROM CHARGES WITH UNDESIRABLE POLARITY

(75) Inventor: Thierry Ducourant, Voiron (FR)

(73) Assignee: Trixell S.A.S., Moirans (FR)

( * ) Notice: Subject to any disclaimer, the term of this patent is extended or adjusted under 35 U.S.C. 154(b) by 97 days.

(21) Appl. No.: 09/736,121

(22) Filed: Dec. 15, 2000

(65) Prior Publication Data

US 2001/0004328 A1 Jun. 21, 2001

(30) Foreign Application Priority Data

Dec. 17, 1999 (FR) .......................................... 99 15995

(51) Int. Cl.[7] ............................................. H01L 27/00
(52) U.S. Cl. ................................ 250/208.1; 250/214 R
(58) Field of Search .......................... 250/208.1, 214 R; 348/294, 308, 302; 257/290, 291, 440

(56) References Cited

U.S. PATENT DOCUMENTS

| | | | | |
|---|---|---|---|---|
| 4,055,836 A | * | 10/1977 | Weimer ...................... | 257/248 |
| 4,827,145 A | | 5/1989 | Arques ....................... | 250/578 |
| 5,777,495 A | | 7/1998 | Arques et al. ................ | 327/94 |
| 5,973,327 A | | 10/1999 | Moy et al. ............. | 250/370.19 |
| 6,265,737 B1 | * | 7/2001 | Ducourant .................. | 257/290 |
| 6,410,898 B2 | * | 6/2002 | Ducourant et al. ...... | 250/208.1 |

FOREIGN PATENT DOCUMENTS

EP 0 665685 8/1995

* cited by examiner

Primary Examiner—Que T. Le
(74) Attorney, Agent, or Firm—Oblon, Spivak, McClelland, Maier & Neustadt, P.C.

(57) ABSTRACT

A circuit for reading charges injected at an input of the circuit including a read MOS transistor having first and second electrodes corresponding to a drain-source pair and for reading charges having a first polarity that are injected at the input of the circuit. The read MOS transistor is controlled by a control voltage that varies in a manner substantially inversely proportional to an input voltage of the circuit. Also included is an integration capacitor mounted between the first electrode of the read MOS transistor and a reference potential in which the input of the circuit is at the second electrode of the read MOS transistor, a charge detector for detecting charges having a second polarity that is opposite to the first polarity that are injected at the input of the circuit, and an imposing mechanism for imposing on the input voltage of the circuit, after the charge detector detects the charges having the second polarity, an equilibrium value equal to or close to a basic value that it takes between two successive operations of integrating charges with the first polarity so as to prevent a prolonged blocking of the read MOS transistor when charges having the first polarity arrive at the input of the circuit.

25 Claims, 6 Drawing Sheets

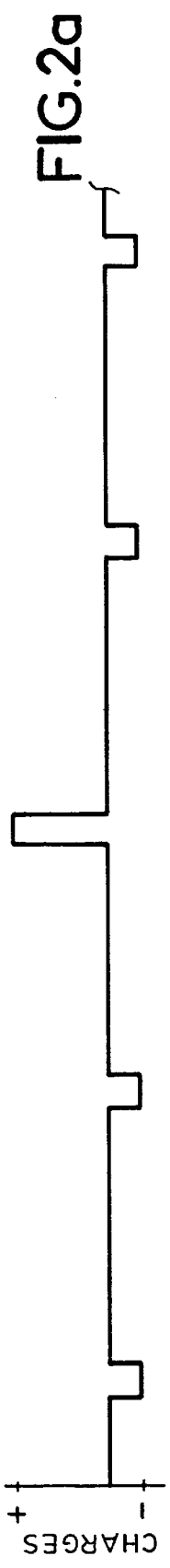
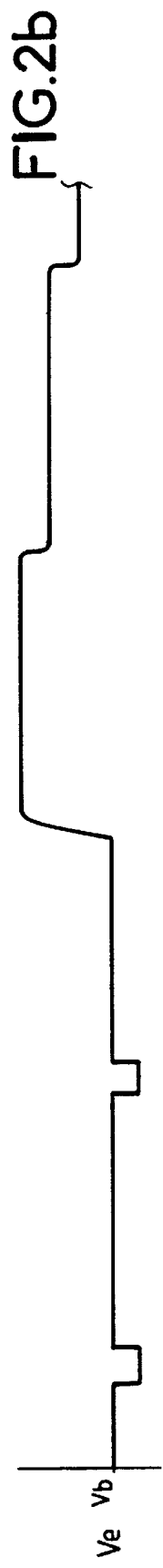
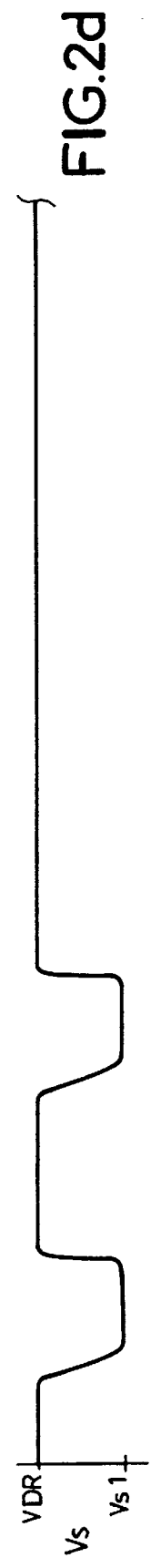
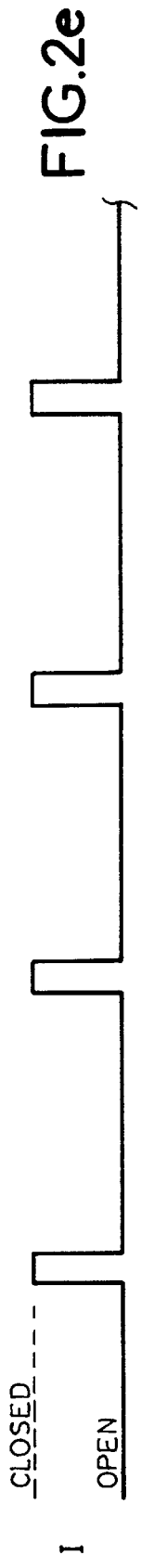

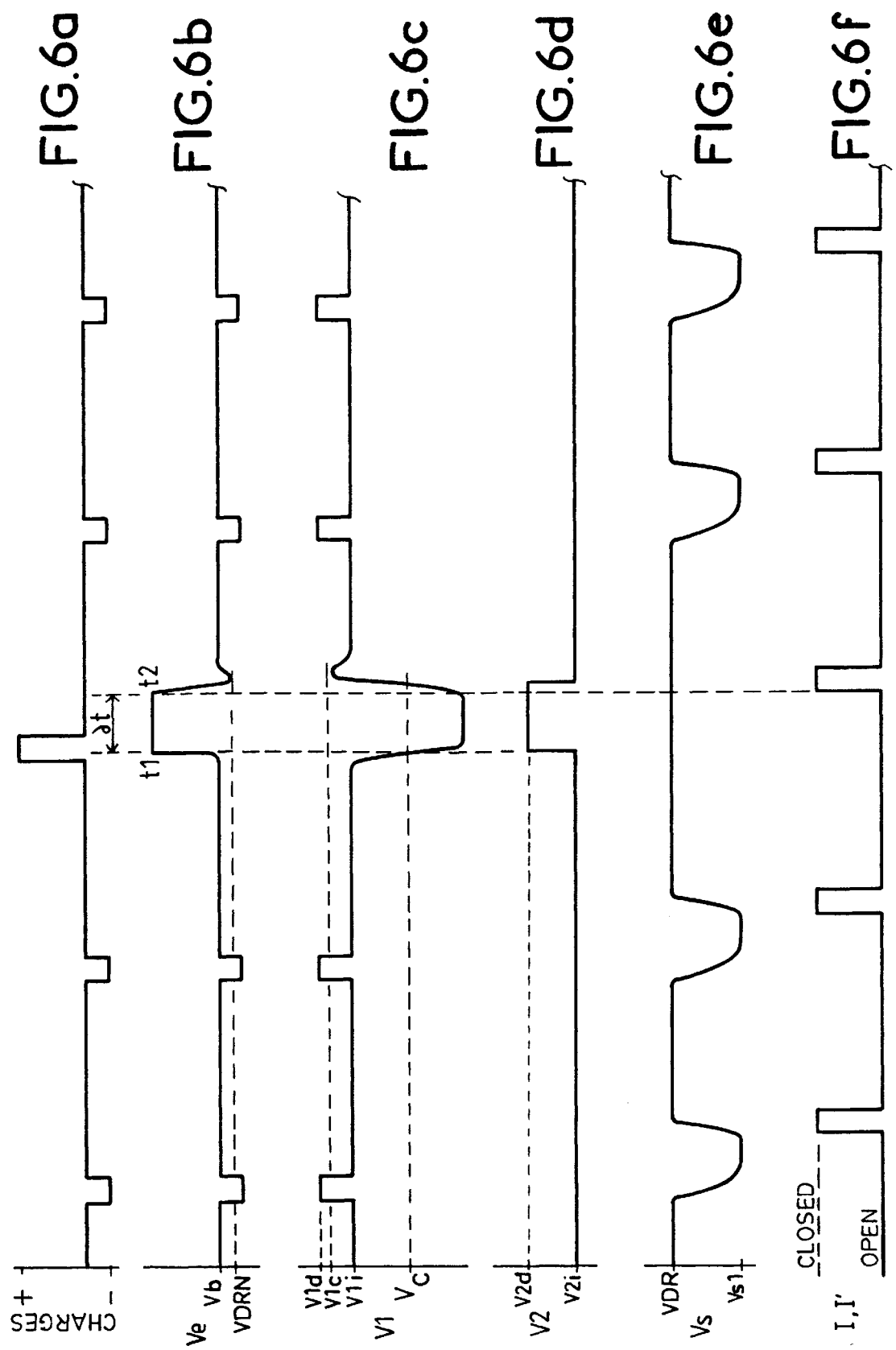

CHARGE-READING CIRCUIT PROTECTED AGAINST OVERLOADS COMING FROM CHARGES WITH UNDESIRABLE POLARITY

BACKGROUND OF THE INVENTION

1. Field of the Invention

The present invention is related to charge-reading circuits designed especially for the reading of charges picked up by solid-state image sensors.

2. Description of the Prior Art

These charge reading circuits are of the charge integrator type. Prior art read circuits 30 of this kind are shown in FIG. 1. More particularly, FIG. 1 shows an image sensor 1 with a plurality of photosensitive dots P1 to P9 each connected between a row conductor Y1 to Y3 and a column conductor X1 to X3. Each photosensitive dot P1 to P2 is formed by a photosensitive diode Dp series-connected with a switch function element in the form of a selection-switching diode Dc. A transistor could have been used as a switch function element. The row conductors Y1 to Y3 are connected to at least one addressing device 3 while the column conductors X1 to X3 are connected to a read device CL comprising as many read circuits 30 as there are column conductors X1 to X3. These read circuits 30 are capable, during an integrating operation, of converting charges into voltage. These charges are collected at the junction point A between the photosensitive diode Dp and the switch function element Dc of a photosensitive dot to which they are connected. This collecting of charges takes place when the photosensitive diodes Dp are in a receptive state and. the photosensitive dots are exposed to a piece of information to be sensed.

The reading of all the photosensitive dots connected to one and the same row conductor Y1 to Y3 is done at the same time, row conductor by row conductor. The photosensitive dots of one and the same column conductor X1 to X3 are read, each in turn, by the read circuit 30 connected to this column conductor.

It is sought to ensure that the conversion is done with a relationship of proportionality that is as constant as possible between the quantity of charges collected and the voltage delivered by the read circuit 30 so that the image delivered by the read device CL is as close as possible to the image to be detected.

Each read circuit 30 has an input E formed by one of the electrodes of the pair formed by the drain d and the source s of a read MOS transistor M1. This input E is connected to one of the column conductors X1 to X3 on which the collected charges flow. The output S of the read circuit 30 is obtained on the side that has the other electrode (source s or drain d) of the read MOS transistor M1 which is connected to one of the plates of an integration capacitor C. The other plate receives a reference voltage VDR. There is a direct transfer of the charges injected into the input E of the read circuit 30 through the read MOS transistor M1 and integration by the capacitor C if the transistor is conductive. The transfer of the charges can be accelerated by the application of a control voltage V1 at the gate g of the read MOS transistor M1. This control voltage V1 is delivered by an acceleration inverter amplifier A1 whose input is connected to the input E of the read circuit 30. The voltage V1 is such that:

$$V1 = -G \times Ve$$

with Ve as the input voltage E of the read circuit 30 and G as the voltage gain of the amplifier A1. In practice, the gain G is high and is chosen for example to be between 500 and 1000 so as to reduce the noise associated with the transfer of the charges between the input E and the output S. The amplifier inverter A1 is supplied with a negative supply voltage VR (for example in the range of −2.75 volts).

It is furthermore planned, in parallel with the capacitor C, to obtain a switch I in order to reinitialize it when all the charges coming from a photosensitive dot have been integrated and before integrating those coming from another photosensitive dot.

This type of read circuit 30 is a one-way circuit and this is a drawback because it can integrate only charges with a single type of polarity, namely either positive charges (holes) or negative charges (electrons). The type of polarity is conditioned by the nature of the channel of the read MOS transistor M1.

If the MOS transistor M1 is an N channel transistor, the charges injected into the MOS transistor M1 can be none other than electrons and the voltage VDR is more positive than the voltage Ve. If, instead of electrons, it is holes that are injected, the input voltage Ve becomes more positive then the reference voltage VDR and the control voltage V1 then blocks or turns off the read MOS transistor M1. So long as the read MOS transistor M1 is off, the charges injected into the input E of the read circuit 30 cannot be integrated and the pieces of information that they convey are then lost. The timing diagrams of FIGS. 2a to 2e respectively show the forms of the quantity of charges reaching the input E of one of the read circuits 30, the voltage Ve at the input E of the circuit, the control voltage V1 applied to the gate g of the read MOS transistor M1, the voltage Vs at output S of the read circuit 30 and finally the state of the switch I which reinitializes the capacitor C. It is assumed that, in the example described, the MOS transistor M1 is an N channel transistor and that the read circuit can read quantities of negative charges or electrons. If the transistor were a P channel transistor, it would be capable of reading holes, and the signs of the voltages and their direction of variation would be reversed in the following description.

When electron packets reach the input E of the read circuit, the voltage Ve at the input E of the circuit 30 decreases suddenly from a basic value Vb, the control voltage V1 for its part starts rising from an initial value V1i up to a value V1d and the MOS transistor M1 gets unblocked. The basic value Vb is equal to the sum of the supply voltage VR of the acceleration amplifier A1 and the threshold voltage of the transistor included in the amplifier. The amplifier A1 is not described in detail.

The charges can be integrated. The voltage Vs at the output S, initially taken to the value VDR, starts decreasing until it reaches the value Vs1 after the integration of all the charges received. When all the charges are integrated, the voltage Ve at its input returns to its base value Vb, the voltage V1 at the output also returns to the initial value V1i and the read MOS transistor M1 goes off. The voltage Vs keeps the value Vs1 reached so long as the resetting switch I remains open and then returns to the reference value VDR as soon as it is closed.

When a photosensitive dot is defective, i.e. when at least one of its components (photosensitive diode Dp or switch function element Dc) is out of operation, a large number of holes reaches the input E of the read circuit 30 to which it is connected. This number is generally far greater than the number of the electrons reaching a photosensitive dot in functioning condition even if it has been exposed TO A highly intense light flux. This arrival of holes is called reverse over-dazzling. The voltage Ve at input greatly increases. The control voltage V1 which follows the variations in the voltage Ve at the input, in reversing and amplifying these variations, decreases sharply. The MOS transistor M1 which was off or blocked remains blocked. The voltage Vs at the output S does not vary but remains at the reference value VDR. The closing of the resetting switch I has no effect on the voltage Vs at the output. When electrons reach the input E of the read circuit once again, the voltage Ve at the input decreases slightly and the control voltage V1 decreases too, but this is not enough to unblock the read MOS transistor M1. The voltage Vs at the output does not vary and the information carried by the electrons that reach the input E is lost. At the input of the read circuit, at least as many electrons as holes must be recovered in order to unblock the read MOS transistor M1. In the image detected, this takes the form of a column portion that remains black. This portion corresponds to all the photosensitive dots of the column read after the one that is defective so long as the MOS transistor M1 has not been unblocked. It is not rare for the black column portion to correspond to more than about ten photosensitive dots. This defect cannot be tolerated.

Similarly, if the read MOS transistor M1 is a P channel type transistor, the charges injected through the MOS transistor M1 can only be holes and the reference value VDR is more negative than the voltage Ve at input. If, instead of holes being injected, it is electrons that are injected, the voltage Ve at the input becomes more negative than the reference value VDR, and the control voltage V1 then blocks the MOS transistor M1. So long as the MOS transistor M1 is blocked, no more charges can be integrated and the information that they carry is then lost.

In any case, this type of read circuit 30 goes off when it has to work with-charges having polarity opposite to the polarity for which it was designed.

The present invention seeks to eliminate the blocking of the charge-reading circuit during the reading of the charges coming from a defective photosensitive dot and makes the circuit operational for the reading of the first non-defective photosensitive dot that follows. A defective photosensitive dot does not disturb the subsequent reading, by the same circuit, of other photosensitive dots which for their part are in a functional state.

SUMMARY OF THE INVENTION

To achieve this goal, the present invention proposes a circuit for the reading of charges injected at its input, comprising a read MOS transistor and an integration capacitor mounted between a first electrode of the drain-source pair of the read MOS transistor and a reference potential. The type of MOS transistor conditions the polarity of the charges that the read circuit is capable of reading without getting blocked. The input of the circuit is at the second electrode of the drain-source pair of the read MOS transistor. The charges injected at the input must cross the read MOS transistor to be integrated by the capacitor. The read MOS transistor is controlled by a a control voltage that varies in a manner that is substantially inversely proportional to the input voltage. The circuit has means to detect the arrival, at the input, of charges with a polarity opposite to the polarity of the charges that it is capable of reading and means for the imposing, on the input voltage, after a detection of this kind, of an equilibrium value equal or close to a basic value that it takes between two successive operations of integrating charges with the desired polarity so as to prevent a prolonged blocking of the read MOS transistor at the arrival of charges with a desired polarity.

The means for detecting the arrival of charges of an undesired polarity may be obtained by an inverter amplifier whose input receives the control voltage. The amplifier has a selection-switching threshold. The crossing of this threshold by the control voltage, in moving away from the initial value taken when the value of the voltage at.input is the basic value, expresses the presence of charges with an undesired polarity at input.

The means used to impose the equilibrium value may comprise an unblocking MOS transistor. One of the electrodes of the drain-source pair of this MOS transistor is connected to the input while the other electrode of the drain-source pair is taken to the equilibrium value. This MOS transistor is controlled by the output of the means to detect the arrival of charges with an undesired polarity.

To prevent the appearance of unwanted oscillations, the read circuit may comprise means to delay the imposing of the equilibrium value with respect to the detection of the arrival of the charges with undesired polarity.

The means used to delay the imposing of the equilibrium value may be obtained by a delay switch which, so long as it is open, prevents the application of the equilibrium voltage at input. This delay switch is connected to one of the electrodes of the drain-source pair of the unblocking MOS transistor.

With a view to simplification and efficiency, the control of the delay switch may be made synchronous with that of the reinitializing switch parallel-connected with the integration capacitor.

The selection-switching threshold is lower than the initial value of the control voltage when the read circuit is designed to read electrons and higher than this voltage when the read circuit is designed to read holes.

Similarly, the equilibrium value is lower than or equal to the basic value when the read circuit is designed to read electrons and it is higher than or equal to this basic value when the read circuit is designed to read holes.

The control voltage can be delivered by an inverter amplifier mounted between the input and the gate of the read MOS transistor. It is preferable to choose this high gain amplifier.

BRIEF DESCRIPTION OF THE DRAWINGS

Other features and advantages of the invention shall appear from the following examples illustrated by the appended figures, of which:

FIGS. 2a to 2e (already described) are timing diagrams showing especially the progress of the voltages at input and output of one of the read circuits of FIG. 1 as a function of the arrival of charges;

FIGS. 6a to 6f are timing diagrams showing especially the progress of the voltages at input and output of one of the read circuits of FIG. 5 as a function of the arrival of charges.

For the sake of clarity, these figures are not necessarily drawn to scale.

DESCRIPTION OF THE PREFERRED EMBODIMENTS

Figure 1:
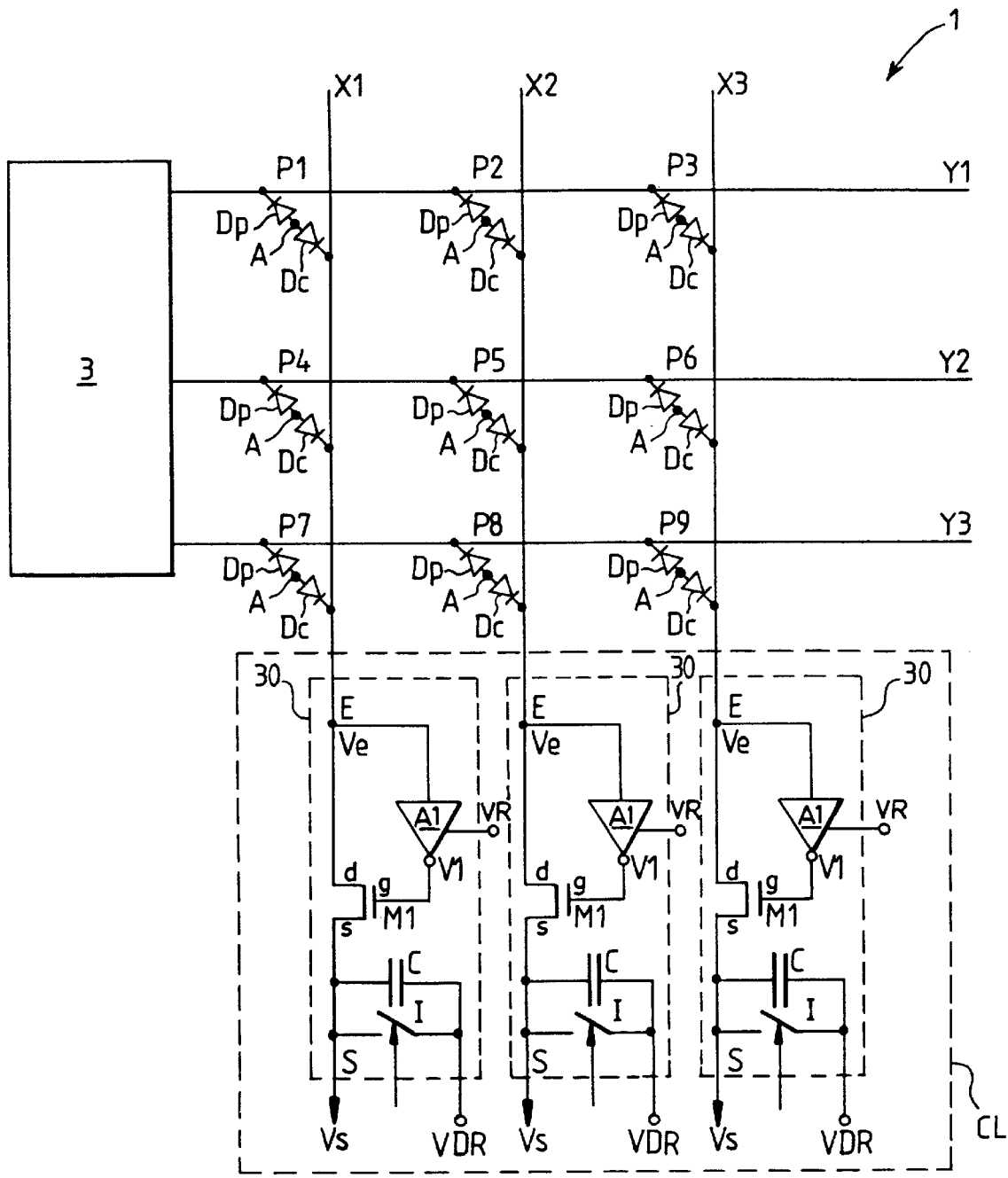
FIG. 1, which has already been described, shows a solid-state image sensor associated with prior art typeread circuits.
Figure 3:
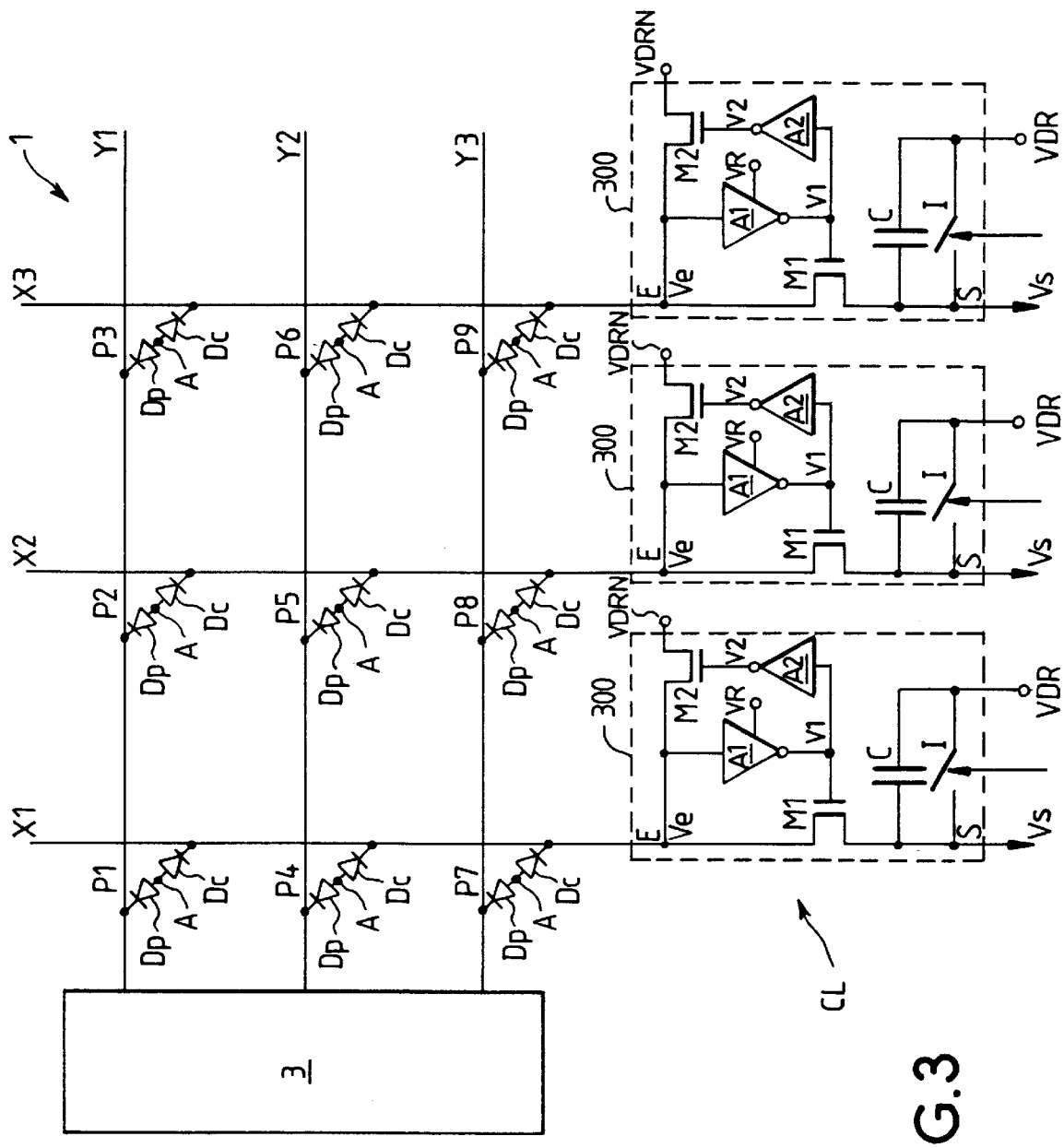
FIG. 3 shows a solid-state image sensor associated with a first configuration of read circuits according to the invention.
Figure 4:
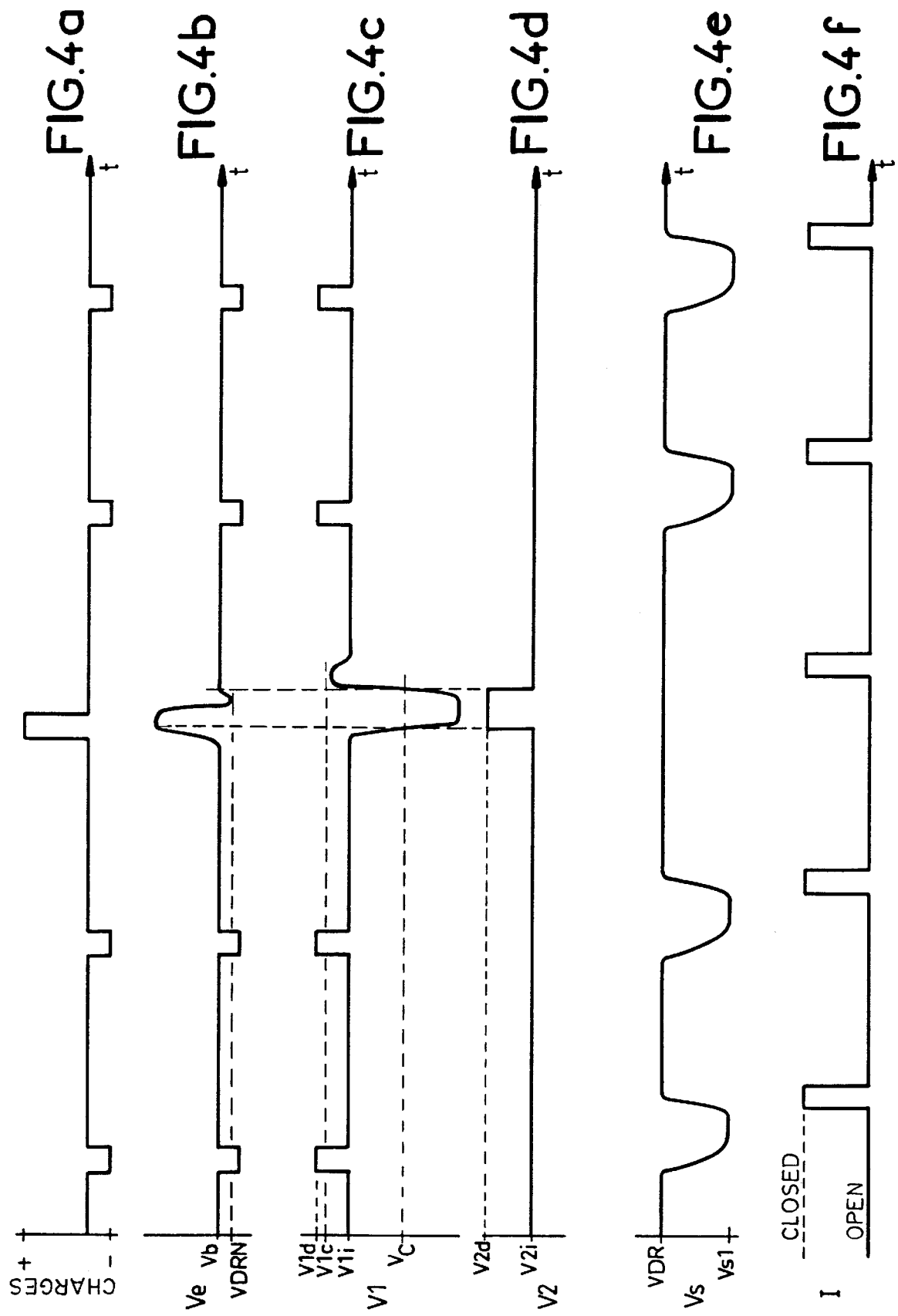
FIGS. 4a to 4f are timing diagrams showing especially the progress of the voltages at input and output of one of the read circuits of FIG. 3 as a function of the arrival of charges.

FIG. 3 gives a view, as in FIG. 1, of a diagram showing an image sensor associated with several charge-reading circuits 300 according to the invention. The structures of the image sensor and of the addressing device are identical to those of FIG. 1. The read circuits 300 are based on those shown in FIG. 1 with additional characteristics.

Each read circuit 300 has means to detect the arrival of charges with undesirable polarity and means for the imposing, on the input voltage, after detection of the arrival of charges with undesired polarity, of an equilibrium value close to or equal to the basic value taken by this circuit between two successive operations for integrating charges with desired polarity so as to prevent a blocking of the circuit at the arrival of charges with desired polarity.

More specifically, the means used to detect the arrival of the charges with undesired polarity can be obtained by a second inverter amplifier A2 series-connected with the acceleration inverter amplifier A1, at its output. The means M2 for imposing an equilibrium value VDRN, close to or equal to the basic value Vb, on the input E of the read circuit 300 comprise an unblocking MOS transistor M2 whose gate g is controlled by the output of the second inverter amplifier A2. One of the electrodes of the pair of drain-source electrodes of this MOS transistor M2 is taken to the equilibrium value VDRN while the other electrode of the pair is connected to the input E of the circuit. Preferably, an equilibrium value (VDRN) will be chosen that is slightly different from the basic value Vb because this value Vb is not known with very great precision and it is necessary to take account of the fluctuations in the electrical values of the semiconductor components.

In practice, if the supply voltage VR is equal to −2.75 volts and the basic value Vb is equal to −1.2 volts, it is possible to choose an equilibrium value VDRN at −1.5 volts giving a margin of 0.3 volts.

The gain of the second amplifier A2 is not of critical importance because there is no problem of noise on this stage. It is preferably chosen with very low electrical consumption so as not to add unnecessary dissipated power.

The second inverter amplifier A2 has a selection-switching threshold Vc that reflects the presence of charges with undesired polarity at the input E of the read circuit 300. This means that the output voltage V2 of the second inverter amplifier A2 remains constant, at an initial value V2i, so long as the control voltage V1 has not crossed the selection-switching threshold Vc from its initial value V1i. As soon as the threshold Vc is crossed, the output voltage V2 follows the variations of the control voltage V1 with an effect of reversal and amplification. As soon as the control voltage V1 crosses the selection-switching threshold Vc towards the initial value V1i, the output voltage V2 returns to its initial value V2i.

As in FIGS. 2a to 2e, the timing diagrams of FIGS. 4a to 4f show the forms, respectively, of the quantity of charges reaching the input E of one of the read circuits 300, the voltage Ve at input E of the circuit, the control voltage V1 applied to the gate g of the MOS transistor M1, the voltage V2 at output of the second inverter amplifier A2, the voltage Vs at output S of the read circuit 30 and finally the state of the switch I which reinitializes the capacitor C. It is assumed that, before the arrival of the first charges, the input voltage Ve is at the basic value Vb, the control voltage V1 is at an initial value V1i, the output voltage V2 of the second inverter amplifier A2 is at an initial value V2i and the output voltage Vs is at the reference value VDR.

When charges of a desired polarity (in the example electrons) reach the input E of the read circuit 300, the voltage Ve starts decreasing from the basic value Vb.

The control voltage V1 starts rising from the initial value V1i until it reaches the value K1d such that the read MOS transistor M1 is in an unblocked state. Its threshold voltage V1c has been reached. The charges can be integrated. The output voltage V2 of the second inverter amplifier A2 remains constant at its initial value V2i and the unblocking MOS transistor M2 which was initially blocked remains blocked. The voltage Vs at the output S of the circuit, initially carried to the value VDR, starts decreasing until it reaches the value Vs1 after integration of all the charges received. When all the charges are integrated, the voltage Ve at the input returns to its basic value Vb, the voltage V1 at the output also returns to its initial value V1i and the read MOS transistor M1 gets blocked. The voltage V2 remains at its initial value V2i because the selection-switching threshold Vc has not been passed by the control voltage V1. The releasing MOS transistor M2 remains off. The voltage Vs keeps the value Vs1 achieved so long as the reinitializing switch I remains in the open position and then goes back to the reference value VDR as soon as the switch I is closed.

When a large number of charges with undesired polarity (holes in the example) reach the input E of the read circuit 300, the voltage Ve at the input increases greatly from the basic value Vb and the control voltage V1, which varies in a substantially inversely proportional way with respect to the voltage Ve at the input, decreases sharply from the initial value V1i. The read MOS transistor M1 which was initially blocked remains blocked. Its threshold voltage V1c is not reached by V1. The output voltage Vs remains at its reference value VDR. As soon as the control voltage V1 crosses the selection-switching threshold Vc of the second inverter amplifier A2, the output voltage V2 which was at an initial value V2i starts rising until it reaches an unblocking value V2d of the unblocking MOS transistor M2. The arrival of charges with undesired polarity has been detected. The fact that the unblocking MOS transistor M2 becomes conductive results in the imposing, on the input voltage Ve, of the equilibrium value VDRN.

The equilibrium value VDRN is, in this case, smaller than or equal to the basic value Vb because the charges of undesired polarity are holes and the read MOS transistor M1 is an N type MOS transistor. If the charges with undesired polarity had been electrons and if the MOS read transistor M1 had been a P type transistor, then the equilibrium value VDRN would have been greater than or equal to the basic value Vb. The variation of the voltage Ve towards the value VDRN results in an increase in the control voltage V1 which again crosses the selection-switching threshold Vc of the second inverter amplifier A2. The voltage V2 at output of the second inverter amplifier A2 returns to the initial voltage V2i and the unblocking MOS transistor M2 gets blocked. The input voltage Ve then resumes its basic value Vb and the control voltage V1 resumes its initial value V1i.

The read MOS transistor M1 for its part remains blocked so long as the control voltage V1 has not reached the threshold voltage V1c of the read transistor and the voltage Vs at the output of the read circuit 300 remains at its reference value VDR. This variant is shown in the timing diagram of FIG. 4e.

The information delivered by the read circuit during the reading of the defective photosensitive dot is lost since the voltage Vs at the output does not vary. What counts is that, when the charges with desired polarity arrive once again at the input E of the read circuit 300, it should be possible to read these charges. This is truly the case.

It may happen that the read MOS transistor M1 gets unblocked if the control voltage V1 rises beyond the threshold voltage V1c. A current then flows from the input E to the integration capacitor and the voltage Vs decreases to the value Vs1. The voltage Vs keeps this value so long as the switch I remains in an open position and then resumes its value VDR. A piece of information is delivered by the defective photosensitive dots. What counts however is that, when the charges with desired polarity again reach the input E of the read circuit 300, it should be possible to read them. This is truly the case.

In the example with electron type charges having a desired polarity, the selection-switching threshold Vc of the second inverter amplifier A2 is smaller than the initial value of the control voltage V1. The equilibrium value VDRN is smaller than or equal to the basic value Vb. If it is smaller, it remains close to it. In the example, VDRN equals −1:5 volts instead of −1.2 volts.

With hole type charges having a desired polarity, the threshold Vc would have been greater than the initial value V1i of the control voltage V1 and the equilibrium voltage VDRN would be greater than or equal to Vb. If it is greater than Vb, it remains close to this value. The timing diagrams would be inverted and their representation is not needed to understand the invention.

It is advantageously possible to delay the application of the equilibrium value VDRN with respect to the detection of the arrival of charges having undesired polarity. By making a separation, in time, of the detection of the defect and its correction, it is possible to make the correction more stable and therefore more efficient. Any oscillations that might appear and might be troublesome are eliminated. The correction is applied naturally before the arrival of new charges.

Figure 5:
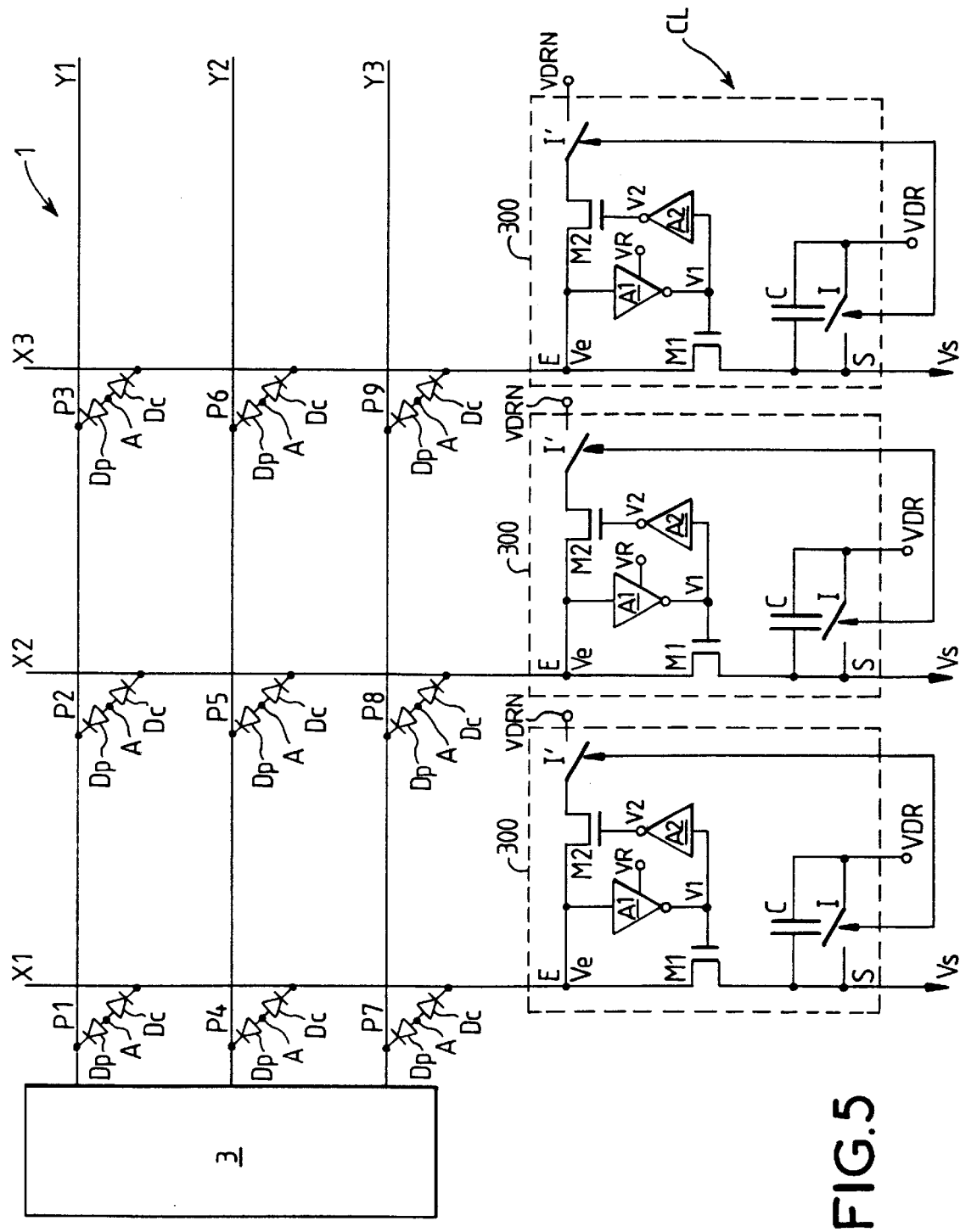
FIG. 5 is a solid-state image sensor associated with a second configuration of read circuits according to the invention, this second configuration introducing the delay switch.

FIG. 5 shows an embodiment of the read circuit used for a delay of the correction of this kind. Means to delay the application of the equilibrium value VDRN work together with the means used to impose this equilibrium value on the input E. The means used to delay the application of the equilibrium value VDRN on the input of the read circuit are formed by a switch I' placed between the voltage source delivering the value VDRN and the input E of the read circuit.

In the drawing, it is connected, firstly, to the second electrode of the drain-source pair of the unblocking MOS transistor M2 and, secondly, to the voltage source delivering the equilibrium value VDRN. It could have been placed between the first electrode of the drain-source pair of the unblocking MOS transistor M2 and the input E.

This switch I' is open so long as the unblocking MOS transistor M2 is blocked, namely when no defect is detected. At the instant t1, when a defect is detected, namely when the selection-switching threshold Vc is crossed by a control voltage V1 which moves away from its initial value V1c, the switch I' keeps its open state. It only changes its state later, at an instant t2 separated from the instant T1 by a time interval δt but of course before the arrival of new charges at the input E.

In the timing diagrams of FIGS. 6, the instants t1 and t2 are identified. In the example described, the instant t2 coincides with the closing of the switch I that reinitializes the capacitor C.

In this advantageous variant, when there are charges of undesired polarity, Vs is prevented from taking the value Vs1. It is still blocked at VDR because the value VDRN is applied to Ve only when the switch I is closed. This synchronization has the advantage of not greatly increasing the number of control circuits. Problems of recovery that might disturb the reading of the following dot are also avoided.

The switches I and I' may be formed by MOS transistors. The read MOS transistor M1 and the unblocking transistor M2 are of the same type and depend on the polarity of the charges to be read.

What is claimed is:

1. A circuit for reading charges injected at an input of the circuit, comprising:

a read MOS transistor having first and second electrodes corresponding to a drain-source pair and for reading charges having a first polarity that are injected at the input of the circuit, said read MOS transistor being controlled by a control voltage that varies in a manner substantially inversely proportional to an input voltage of the circuit;

an integration capacitor mounted between the first electrode of the read MOS transistor and a reference potential, the input of the circuit being at the second electrode of the read MOS transistor;

means for detecting charges having a second polarity that is opposite to the first polarity that are injected at the input of the circuit; and means for imposing on the input voltage of the circuit, after the detecting means detects the charges having the second polarity, an equilibrium value equal to or close to a basic value that it takes between two successive operations of integrating charges with the first polarity so as to prevent a prolonged blocking of the read MOS transistor when charges having the first polarity arrive at the input of the circuit.

2. A charge-reading circuit according to claim 1, wherein the detecting means comprise an inverter amplifier having an input for receiving the control voltage and having a selection-switching threshold, wherein a crossing of the threshold by the control voltage, in moving away from an initial value taken when a value of the input voltage is the basic value, indicates a presence of charges with the second polarity at the input of the circuit.

3. A charge-reading circuit according to claim 1, wherein the imposing means comprise an unblocking MOS transistor having first and second electrodes corresponding to a drain-source pair, wherein one of the first and second electrodes is connected to the input of the circuit, wherein the other electrode of the drain-source pair is connected with the equilibrium value, and wherein said unblocking MOS transistor is controlled by an output of the detecting means.

4. A charge-reading circuit according to claim 1, further comprising means for delaying the imposing of the equilibrium value with respect to the detection of the arrival of the charges having the second polarity.

5. A charge-reading circuit according to claim 4, wherein the delaying means comprise a delay switch which, so long as it is open, prevents the application of the equilibrium value at the input of the circuit.

6. A charge-reading circuit according to claim 5, wherein the delay switch is connected to one of the first and second electrodes of the unblocking MOS transistor.

7. A charge-reading circuit according to claim 5, further comprising, in parallel with the integration capacitor, a reinitializing switch, wherein a control of the reinitializing switch and that of the delay switch are synchronized.

8. A charge-reading circuit according to claim 2, wherein the selection-switching threshold is lower than the initial value when the read circuit is designed to read electrons.

9. A charge-reading circuit according to claim 2, wherein the selection-switching threshold is higher than the initial value when the read circuit is designed to read holes.

10. A charge-reading circuit according to claim 1, wherein the equilibrium value is lower than or equal to the basic value when the read circuit is designed to read electrons.

11. A charge-reading circuit according to claim 1, wherein the equilibrium value is higher than or equal to the basic value when the read circuit is designed to read holes.

12. A charge-reading circuit according to claim 1, wherein the control voltage is delivered by an inverter amplifier mounted between the input and the gate of the read MOS transistor.

13. A charge-reading circuit according to claim 6, further comprising, in parallel with the integration capacitor, a reinitializing switch, wherein a control of the reinitializing switch and that of the delay switch are synchronized.

14. A circuit for reading charges injected at an input of the circuit, comprising:

a read MOS transistor having first and second electrodes corresponding to a drain-source pair and configured to read charges having a first polarity that are injected at the input of the circuit, said read MOS transistor being controlled by a control voltage that varies in a manner substantially inversely proportional to an input voltage of the circuit;

an integration capacitor mounted between the first electrode of the read MOS transistor and a reference potential, the input of the circuit being at the second electrode of the read MOS transistor;

a charge detector configured to detect charges having a second polarity that is opposite to the first polarity that are injected at the input of the circuit; and an imposing mechanism configured to impose on the input voltage of the circuit, after the charge detector detects the charges having the second polarity, an equilibrium value equal to or close to a basic value that it takes between two successive operations of integrating charges with the first polarity so as to prevent a prolonged blocking of the read MOS transistor when charges having the first polarity arrive at the input of the circuit.

15. A charge-reading circuit according to claim 14, wherein the control voltage is delivered by an inverter amplifier mounted between the input and the gate of the read MOS transistor.

16. A charge-reading circuit according to claim 14, wherein the charge detector comprises an inverter amplifier having an input for receiving the control voltage and having a selection-switching threshold, wherein a crossing of the threshold by the control voltage, in moving away from an initial value taken when a value of the input voltage is the basic value, indicates a presence of charges with the second polarity at the input of the circuit.

17. A charge-reading circuit according to claim 14, wherein the imposing mechanism comprises an unblocking MOS transistor having first and second electrodes corresponding to a drain-source pair, wherein one of the first and second electrodes is connected to the input of the circuit, wherein the other electrode of the drain-source pair is connected with the equilibrium value, and wherein said unblocking MOS transistor is controlled by an output of the charge detector.

18. A charge-reading circuit according to claim 14, further comprising a delay mechanism configured to delay the imposing of the equilibrium value with respect to the detection of the arrival of the charges having the second polarity.

19. A charge-reading circuit according to claim 18, wherein the delay mechanism comprise a delay switch which, so long as it is open, prevents the application of the equilibrium value at the input of the circuit.

20. A charge-reading circuit according to claim 19, wherein the delay switch is connected to one of the first and second electrodes of the unblocking MOS transistor.

21. A charge-reading circuit according to claim 19, further comprising, in parallel with integration capacitor, a reinitializing switch, wherein a control of the reinitializing switch and that of the delay switch are synchronized.

22. A charge-reading circuit according to claim 16, wherein the selection-switching threshold is lower than the initial value when the read circuit is designed to read electrons.

23. A charge-reading circuit according to claim 16, wherein the selection-switching threshold is higher than the initial value when the read circuit is designed to read holes.

24. A charge-reading circuit according to claim 14, wherein the equilibrium value is lower than or equal to the basic value when the read circuit is designed to read electrons.

25. A charge-reading circuit according to claim 14, wherein the equilibrium value is higher than or equal to the basic value when the read circuit is designed to read holes.

* * * * *